(12) United States Patent
Tredwell et al.

(10) Patent No.: US 7,948,017 B2
(45) Date of Patent: May 24, 2011

(54) DIGITAL RADIOGRAPHY IMAGER WITH BURIED INTERCONNECT LAYER IN SILICON-ON-GLASS AND METHOD OF FABRICATING SAME

(75) Inventors: Timothy J. Tredwell, Fairport, NY (US); Jackson Lai, Rochester, NY (US)

(73) Assignee: Carestream Health, Inc., Rochester, NY (US)

( * ) Notice: Subject to any disclaimer, the term of this patent is extended or adjusted under 35 U.S.C. 154(b) by 0 days.

(21) Appl. No.: 12/487,678

(22) Filed: Jun. 19, 2009

(65) Prior Publication Data

US 2010/0320514 A1 Dec. 23, 2010

(51) Int. Cl.
*H01L 31/062* (2006.01)
*H01L 31/113* (2006.01)

(52) U.S. Cl. ... 257/292; 257/288; 257/347; 257/E21.17; 257/E21.042; 257/E21.051; 257/E21.213; 257/E21.247; 257/E21.32; 257/E21.37; 257/E21.352; 257/E21.692

(58) Field of Classification Search ............ 257/288, 257/292, 347, 352, 367, 774, E21.17, 42, 257/51, 17, 213, 247, 32, 353, 37
See application file for complete search history.

(56) References Cited

U.S. PATENT DOCUMENTS

| | | | |
|---|---|---|---|
| 4,847,210 A | 7/1989 | Hwang et al. | |
| 5,414,276 A | 5/1995 | McCarthy | |
| 5,488,012 A | 1/1996 | McCarthy | |
| 6,583,030 B1 | 6/2003 | Grassi | |
| 6,610,582 B1 * | 8/2003 | Stewart | 438/455 |
| 6,649,977 B1 | 11/2003 | McCarthy | |
| 6,921,961 B2 | 7/2005 | Sanchez et al. | |
| 7,075,501 B1 * | 7/2006 | Spitzer et al. | 345/8 |
| 7,176,528 B2 | 2/2007 | Couillard et al. | |
| 7,192,844 B2 | 3/2007 | Couillard et al. | |
| 7,268,051 B2 | 9/2007 | Couillard et al. | |
| 7,285,477 B1 | 10/2007 | Bernstein et al. | |

* cited by examiner

*Primary Examiner* — David Nhu

(57) ABSTRACT

A method of forming an imaging array includes providing a single crystal silicon substrate having an internal separation layer, forming a patterned conductive layer proximate a first side of the single crystal silicon substrate, forming an electrically conductive layer on the first side of the single crystal silicon substrate and in communication with the patterned conductive layer, securing the single crystal silicon substrate having the patterned conductive layer and electrically conductive layer formed thereon to a glass substrate with the first side of the single crystal silicon substrate proximate the glass substrate, separating the single crystal silicon substrate at the internal separation layer to create an exposed surface opposite the first side of the single crystal silicon substrate and forming an array comprising a plurality of photosensitive elements and readout elements on the exposed surface.

15 Claims, 7 Drawing Sheets

DIGITAL RADIOGRAPHY IMAGER WITH BURIED INTERCONNECT LAYER IN SILICON-ON-GLASS AND METHOD OF FABRICATING SAME

TECHNICAL FIELD

The present invention relates to imaging arrays on insulating substrates. More specifically, the invention relates to an imaging array for use in a large area flat panel digital radiography imaging sensor formed using silicon on glass and having one or more buried interconnect layers formed on the silicon wafer prior to being attached to the glass substrate.

DESCRIPTION OF RELATED ART

Image sensors fabricated in single-crystal silicon and from deposited semiconductors, such as amorphous or polycrystalline silicon, are well known.

Image sensor arrays fabricated in single-crystal silicon generally include a photosensitive element, a readout circuit and several layers of metal interconnect. Examples of photosensitive elements include p-n junction photodiodes, metal-insulator-semiconductor photo-capacitors, charge coupled devices, phototransistors, and pinned photodiodes. Examples of readout circuits include charge-coupled devices, passive pixel readout circuits (typically with one transistor) and active pixel readout circuits (typically with three or more transistors per pixel). Examples of interconnects used in image sensors include bias lines, address lines and signal readout lines. Prior art image sensors in single-crystal silicon add layers of interconnect through successive deposition and patterning of conductive layers, such as metals, metal silicides, or doped polysilicon. These interconnect layers are used for functions such as bias supply, clock lines, data lines and grounds. The interconnect layers are generally opaque, and since they are generally routed over the photosensor, the fill factor of the photosensor in the pixel is greatly reduced, to generally less than 25%. In image sensors used in systems with optical image projection, such as digital cameras and camcorders, a micro-lenslett array fabricated on the image sensor allows light to be focused onto the photosensitive area in each pixel. However, for image sensors used in indirect digital radiography, the image sensor is in direct contact with the scintillator which converts incident X-rays to visible light photons. Lensletts do not provide any improvement in light collection efficiency for imaging arrays in contact with a scintillator.

FIG. 1 illustrates a circuit diagram for a conventional pixel design for an image sensor in single-crystal silicon. Each pixel 10 includes a photodiode 12, a transfer gate transistor 14, an amplifier transistor 16 that converts the voltage on one terminal of the photosensor to a current, a reset transistor 18 that restores the bias voltage on the photodiode 12, and a row select transistor 20. The interconnect between the pixels includes six lines, namely, a row select line 22, a reset gate line 24, and a transfer gate line 26, arranged horizontally, and a data line 28 for signal readout, a voltage supply line 30, and a bias line 32, arranged vertically. This conventional interconnect structure is generally formed in two or more layers, for example, with the horizontally-oriented lines in a first level of metal and the vertically-oriented lines in a second level of metal. As noted above, the interconnect forms a substantial portion of the pixel area, and when formed on top of the photosensitive layer, as in conventional arrays, the fill factor of the pixel is significantly lowered.

Image sensors fabricated from deposited semiconductors, such as amorphous silicon deposited on glass substrates, are formed by deposition of thin films of metals, insulating materials, and semiconductor materials. Since the semiconductor is deposited as one step in the overall process, the interconnects can be below and/or above the semiconductor materials. For amorphous silicon processes, at least one layer of interconnect is above the semiconductor layer. For polysilicon processes, several metal layers are disposed above the semiconductor layer. Again, because the interconnects are opaque, fill factor of the photosensor is reduced. In addition, because of the need to maximize fill-factor and to minimize topography, the width and thickness of the interconnects is limited, resulting in high-resistance power, addressing and readout interconnect.

Thus, there is a need in the art for an image sensing device in which the impact of the interconnect dimensions on fill factor is minimized. There also is a need in the art for an image sensing device having an interconnect with lowered capacitance and resistance.

SUMMARY OF THE INVENTION

The present invention relates to an improved image sensing device that remedies the foregoing needs in the art.

In a first aspect, the present invention relates to a method of forming an imaging array. The method includes providing at least one single crystal silicon substrate having an internal separation layer, forming a first insulating layer on the substrate, proximate the internal separation layer, forming a patterned conductive layer proximate the first insulating layer, securing the single crystal silicon substrate having the patterned conductive layer formed thereon to a glass substrate with the first side of the single crystal silicon substrate proximate the glass substrate, separating the single crystal silicon substrate at the internal separation layer to create an exposed surface opposite the first side of the single crystal silicon substrate, and forming, on the exposed surface, an array comprising a plurality of photosensitive elements and readout elements In another aspect, the present invention provides an imaging array. The imaging array includes a glass substrate, a single crystal silicon layer having a thickness of less than about 5 microns, an electrically conductive layer, first conductive areas, and an array of photosensitive elements. The single crystal silicon layer is secured to the glass substrate. The electrically conductive layer is formed between the glass substrate and the single crystal silicon layer. The first conductive areas are at a surface of the single crystal silicon proximate the glass substrate. The electrically conductive layer communicates with the conductive areas. Each of the photosensitive elements includes the single crystal silicon layer and one of the first conductive areas.

These and other aspects, objects, and features of the invention may be appreciated with reference to the accompanied detailed description of the invention and Figures, which describe and illustrate preferred embodiments of the present invention.

DETAILED DESCRIPTION OF THE INVENTION

As noted above, the present invention relates to an improved image sensing device and a method of making such a device. The device preferably is a large area, e.g., approximately greater than 6 inches by 6 inches, flat panel digital radiography imaging sensor. The invention is not limited to this application, however, as the methodologies described below could be used in other applications. Preferred embodiments of the invention now will be described with reference to the Figures.

Figure 2:
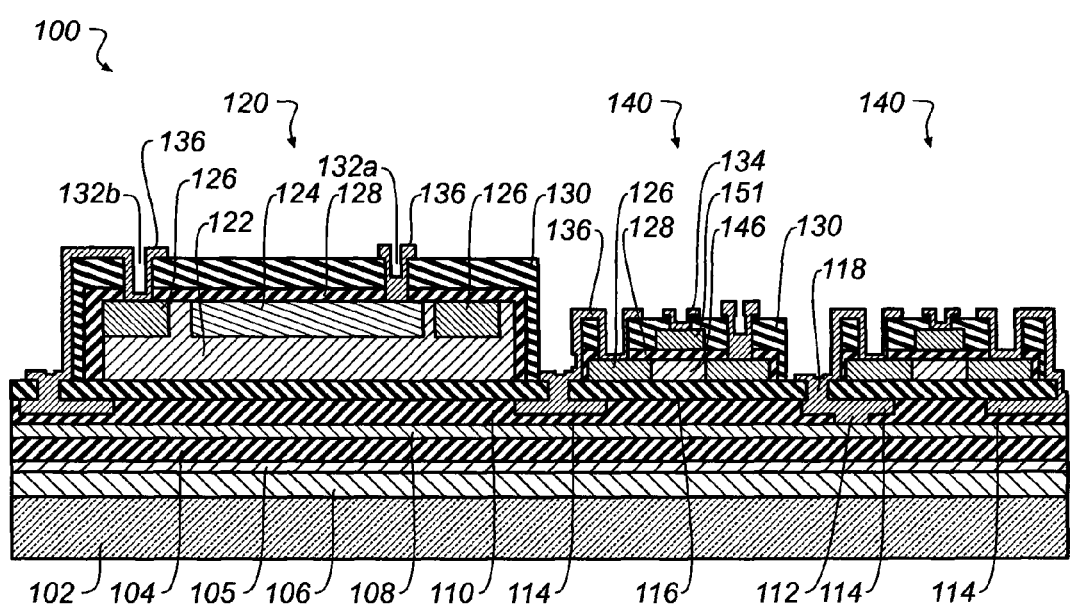
FIG. 2 is a cross-sectional view of an image sensing pixel according to a first embodiment of the invention.

FIG. 2 is a cross-sectional view of a pixel 100 according to a preferred embodiment of the invention. The pixel 100 is one of multiple pixels in an array and is formed on a glass substrate 102 to which a silicon layer 105 is bonded via an anodic bond 106. A first insulating layer 104, which is a dielectric, preferably formed from an inorganic insulating material such as silicon dioxide, is disposed on the silicon layer 105. A first patterned conductive layer 108 is disposed on the first insulating layer 104. As will be described in more detail below, the first patterned conductive layer 108 preferably is a first global interconnect layer. A second insulating layer 110 is disposed on the first patterned conductive layer 108. The second insulating layer 110 and is arranged to insulate the first patterned conductive layer 108 from subsequently formed layers, save through one or more via holes 112. The via holes 112 are formed through the second insulating layer 110 to allow access to the first patterned conductive layer 108 through the second insulating layer 110. As noted above, the first patterned conductive layer 108 preferably forms an interconnect, i.e., a plurality of lines for electrically connecting adjacent pixels, oriented substantially along the row direction of the image sensor. A second patterned conductive layer 114 is formed selectively on the second insulating layer 110. The second patterned conductive layer 114 preferably forms an interconnect oriented substantially in the column direction of the image sensor, perpendicular to the interconnect comprising the first global metallization layer. A portion of the second patterned conductive layer 114 communicates with the first patterned conductive layer 108, through the via holes 112. As will be appreciated, the arrangement of the present invention is not limited to the foregoing; the interconnect of the first patterned conductive layer 108 could be arranged in the columnar direction and the interconnect formed by the second patterned conductive layer 114 could be arranged in rows.

A third insulating layer 116 is formed on the second patterned conductive layer 114, to insulate the second patterned conductive layer 114 from subsequently formed layers. Vias 118 are formed through the third insulating layer 116 to allow for electrical contact with the second patterned conductive layer 114.

The just-described first and second patterned conductive layers and alternating first, second, and third insulating layers, formed on the glass substrate, form most, and in some embodiments all, of the global interconnect for the pixel array circuits. Specifically, in a preferred embodiment and referring to the circuit diagram of FIG. 3, the first patterned conductive layer 108 forms a horizontal global interconnect line 21, consisting of the row select lines 22, the reset gate lines 24 and the transfer gate lines 26. The second patterned conductive layer forms a vertical global interconnect 27, consisting of the data lines 28, the voltage supply lines 30, and the bias supply lines 32 which supply bias to the reset transistor 18 and the amplifier transistor 16. Of course, the first and the second patterned conductive layers could alternately make up additional clock, bias and/or data lines comprising the interconnect. Additionally, the first and second patterned conductive layers can function as local interconnect, connecting circuit elements within the peripheral circuits or within the pixels In other embodiments, the invention could include more or less patterned conductive layers forming interconnects. For example, a single layer of global interconnect could be provided, with only a single patterned conductive layer between first and second insulating layers. In still other embodiments, additional interconnect layers could be included, each of the layers including both a conductive or metallization layer and an insulating layer separating the conductive or metallization layers.

Figure 1:
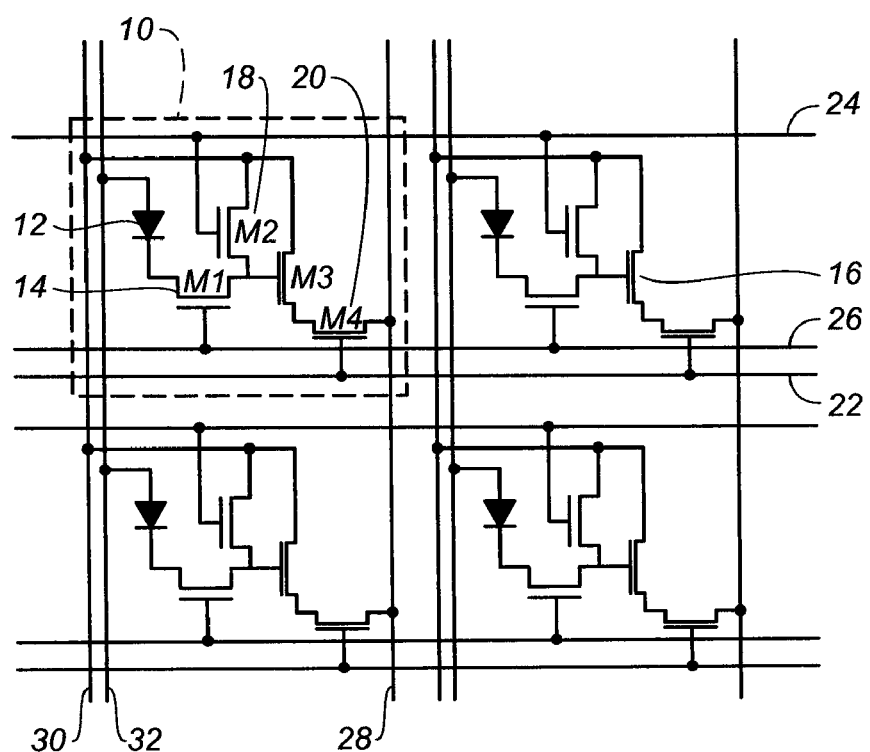
FIG. 1 is a circuit diagram for a conventional pixel structure used in imaging displays.

Referring again to FIG. 2, a photosensor element 120 and transistor elements 140 (of which two are shown) are formed on the third insulating layer 116. In a preferred embodiment, more than two transistors 140 may be provided, and the transistors 140 have substantially the same functioning as one or more of the transistors 14, 16, 18, 20, illustrated in FIGS. 1 and 3. Additionally, the transistors 140 can be used to form peripheral circuitry 298.

The photosensor element 120 and transistor elements 140 include a layer of silicon 122 (p-doped single-crystal silicon in this arrangement) disposed on the third insulating layer 116. In the illustrated embodiment, the silicon layer for the photosensor element 120 and the silicon layer for the transistor element 140 are of different thicknesses. A fourth insulating layer 128 is deposited on the silicon, and forms a gate insulator in the transistor elements 140. A third patterned conductive layer 134 forms a gate electrode 151 for the transistors. This third patterned conductive layer 134 also cooperates with a via (not shown) to contact the second patterned conductive layer 114 which in turn is connected through via holes 112 to the first patterned conductive layer 108.

P+ areas 126 (e.g., regions of silicon doped at a concentration of $>1\times10^{18}$ cm$^{-3}$ with p-type dopant such as boron) are formed proximate the upper surface of the silicon layer 122 in photosensor element 120 and are formed proximate the upper surface of the silicon layer 122 in the transistor elements 140. These regions form the body contact to the photosensor and the PMOS transistor source and drain. N+ doped silicon areas 124 (e.g., regions of silicon doped at a concentration of $>1\times10^{18}$ cm$^{-3}$ with n-type dopant such as phosphorous or arsenic) are formed proximate the upper surface of the silicon layer 122 in photosensor element 120. The N+ and P+ doped areas form a p-n junction photodiode in the photosensor element 120.

A fifth insulating layer 130 is formed on the fourth insulating layer 128. This fifth insulating layer 130 comprises an inter-metal insulator. Vias 132a, 132b are formed through the fourth and fifth insulating layers 128, 130, providing electrical access to the N+ and P+ doped areas of the photosensor element 120 and the transistor elements 140. A fourth patterned conductive layer 136 cooperates with the via 132a to provide electrical connection to the N+ doped silicon areas 124, and with the vias 132b to provide electrical connection to the P+ doped silicon areas 126. This fourth patterned conductive layer 136 also cooperates with the via 118 to provide an electrical connection between the P+ doped silicon area 126 and the second patterned conductive layer 114. For selected bias and clock lines, via holes 112 can connect the second patterned conductive layer 114 to the first patterned conductive layer 108. In the preferred embodiment, the first and second patterned conductive layers preferably are global interconnect layers and the third and fourth patterned conductive layers are local, i.e., intra-pixel, interconnect layers. In this manner, much of the global interconnect, that is, the connection between pixels, is done under the photosensors and transistors, and only the local interconnect is formed on the photosensors and transistors. Such an arrangement greatly improves fill factor.

Figure 3:
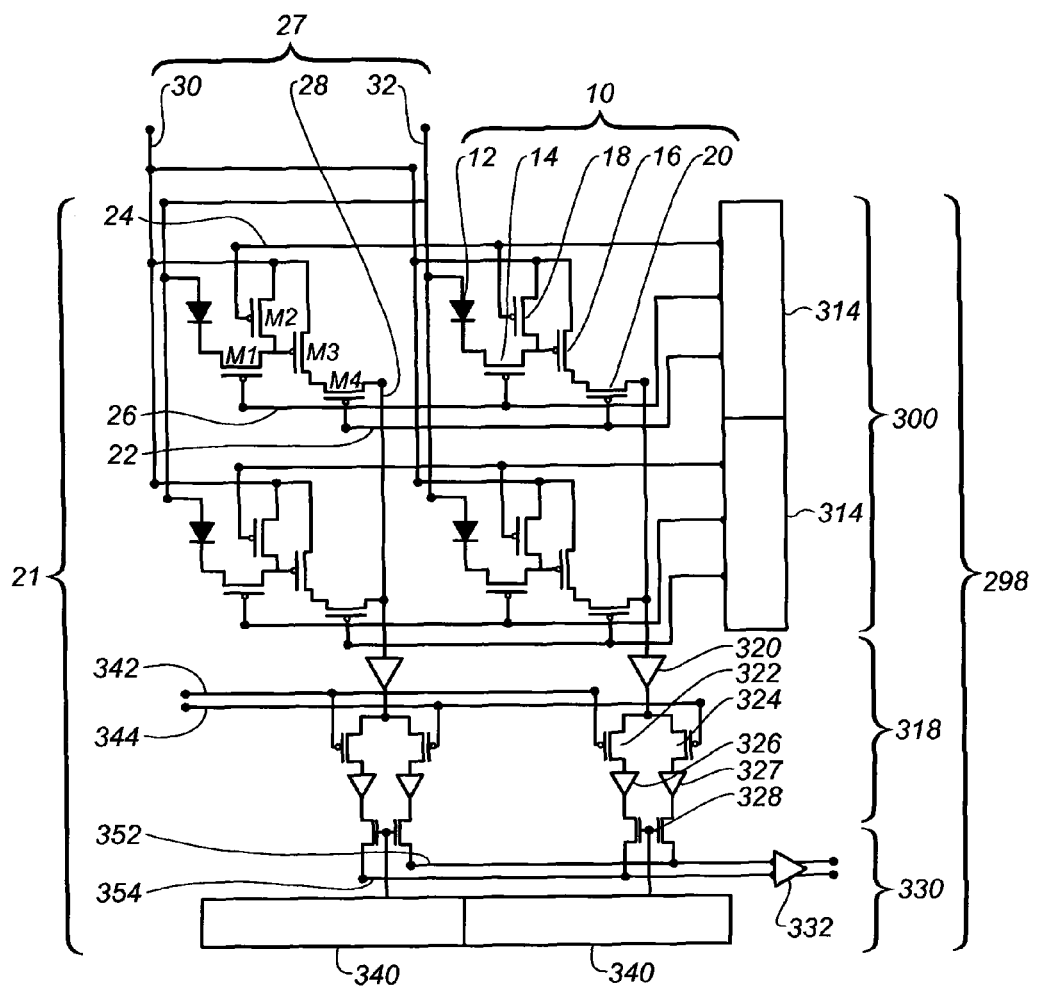
FIG. 3 is a circuit diagram of a preferred embodiment of the image sensing array.

The function of the pixel 100 is similar to that of conventional pixels. FIG. 3 is a circuit diagram showing a plurality of the pixels 100 and peripheral circuitry 298. As shown, each of the pixels 100 includes the photosensitive element (a photodiode in the illustrated example) and transistors, which include the transfer gate transistor 14, amplifier transistor 16, reset transistor 18 and row select transistor 20. The pixels within each row are connected using the horizontal global interconnect lines 21. In the preferred embodiment, the horizontal global interconnect lines 21 are realized in the first patterned conductive layer 108, which as will be described in more detail below, is formed on a silicon wafer prior to bonding the wafer to glass. The pixels within each column are connected using the vertical global interconnect lines 27, which are realized in the second patterned conductive layer 114, also formed on the silicon wafer prior to bonding the wafer to glass. In another embodiment, the first patterned conductive layer 108 could form the vertical global interconnect lines 27 and the second patterned conductive layer 114 could from the horizontal global interconnect lines 21.

The peripheral circuitry 298 comprises vertical addressing circuitry 300 to control the horizontal global interconnect, horizontal addressing circuitry 330 to control the vertical global interconnect, and column amplification and sampling circuitry 318. The peripheral circuitry is preferably formed from PMOS transistors and/or from NMOS transistors similar to PMOS transistors, but with N+ source and drain diffusions in place of the P+ source and drain diffusions.

The vertical addressing circuitry includes vertical address register stages 314. The vertical address register stages 314 create clock signals for the timing of the reset, transfer and row-select operations in a row corresponding to the stage. When a particular row is not being addressed, the vertical address register stage 314 corresponding to that row holds the reset gate line 24, row select gate line 22 and transfer gate line 26 at a voltage that maintains their corresponding transistors in an "off", or non-conducting, state. When a particular row is being addressed, the vertical address register stage 314 corresponding to that row provides appropriate clock signals to the reset gate line 24, row select gate line 22 and transfer gate line 26. These clock signals first turn on (by switching to a conducting state) row select transistor 20, thereby connecting amplifier transistor 16 to column amplifiers 320. Briefly enabling clamp transistor 322 by addressing the clamp clock interconnect line 342 allows a clamp voltage corresponding to the voltage on the amplifier transistor 16 to be held on the corresponding column clamp voltage amplifier 326. The vertical address register stage 314 then turns on the transfer gate line 26, thereby turning on the transfer gate 14 in each pixel in the selected row. This allows the photo-generated charge on the photodiode to shift the voltage on the gate of the amplifier transistor 16 by an amount proportional to the photo-charge stored on the photodiode. This signal may be sampled by enabling sample gate 344, thereby enabling sample transistor 324 and storing the sample charge on the column signal voltage amplifier 327. Following storage of the clamp voltage and the signal voltage amplifiers 326, 327 respectively for all columns, the row readout in the horizontal direction is performed by the horizontal addressing circuitry 330, which includes horizontal address register stages 340, column select lines 328, and an output amplifier 332. As each stage 340 of the horizontal address register is addressed, the column select lines 328 corresponding to that column are enabled, transferring the signal voltage stored on the clamp voltage amplifier 326 and signal voltage amplifier 327 to the horizontal signal lines 352 and 354 for signal and clamp voltages respectively. The output amplifier 332 buffers the signal for driving clamp and signal voltages off-panel.

The present invention is not limited to the illustrated photosensitive element and transistors. As will be appreciated, any photosensitive element could be used in conjunction with the invention, including, but not limited to, p-n junction photodiodes, metal-insulator-semiconductor photo-capacitors, charge coupled devices, phototransistors, and pinned photodiodes. Other known transistors could also be used in place of the illustrated transistor, which is a thin-film transistor.

As noted above, in the first embodiment, circuits containing transistors formed in silicon-on-glass provide the vertical address circuitry 300, the horizontal addressing circuitry 330 and the column amplifier and sampling circuitry 318. Interconnect which spans the width of the imaging array, such as the clamp and sample clock interconnects 342 and 344, the horizontal signal lines 352 and 354, and clock and bias signals for the vertical address register stages 314 and the horizontal address register stages 340, also preferably are realized in the patterned conductive layers 108, 114, although they may be formed in other patterned conductive layers in other embodiments. Preferably, this interconnect is formed on the silicon wafer 170 prior to attachment of the silicon wafer to the glass substrate 102. As will be appreciated, in relatively larger displays in which multiple silicon wafers are placed on a single glass substrate, some electrical interconnect will be required between adjacent pixels on adjacent wafers. That is, an electrical connection is required between the first and second patterned conductive layers in adjacent wafers.

A method of manufacturing the pixel 100 illustrated in FIG. 2 now will be described with reference to FIGS. 4A-4J.

Figure 4A:
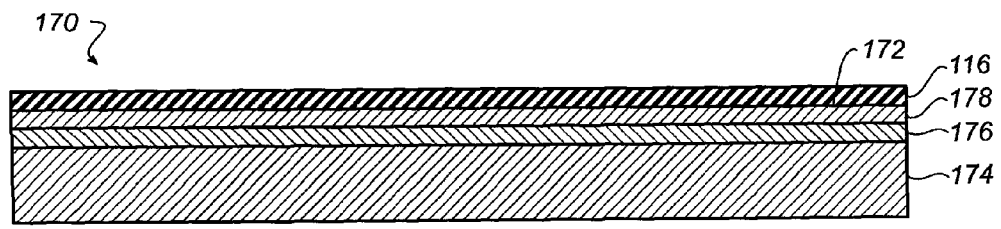
FIGS. 4A-4J are cross-section views illustrating the formation process of the image sensing pixel illustrated in FIG. 2.

In FIG. 4A, a silicon tile or wafer 170 is provided. The silicon wafer 170 preferably is a single crystal silicon substrate and has a first surface 172 and a second surface 174, opposite the first surface 172. A Hydrogen-implanted zone 176 is arranged proximate the first surface 172, defining a thin region of silicon 178 between the Hydrogen-implanted zone 176 and the first surface 172. The Hydrogen-implanted zone 176 is prepared as described in U.S. Pat. Nos. 7,176,528; 7,192,844; and 7,268,051 to form an internal separation layer and preferably is no greater than about 5 microns deep. That is, the thin region of silicon 178 is preferably no thicker than about 5 microns. The third insulating layer 116 is formed on the first surface 172 of the silicon wafer. In this example, the third insulating layer 116 is silicon dioxide, and may be formed on the first surface 172 of the silicon wafer 170 by known techniques, such as by thermal growth in an oxidizing environment or by deposition, such as by chemical vapor deposition (CVD) or sputter deposition. Other insulators, including but not limited to silicon nitride, could alternatively be used in the present invention.

Figure 4B:
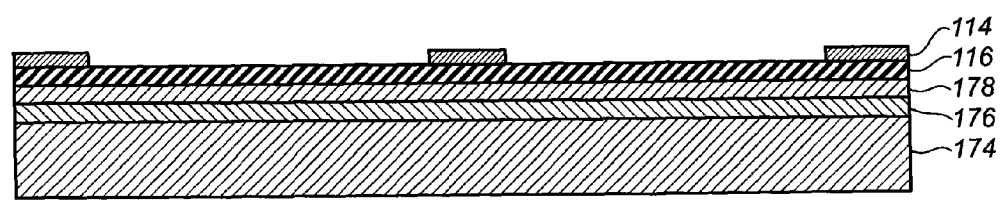
Figure 4C:
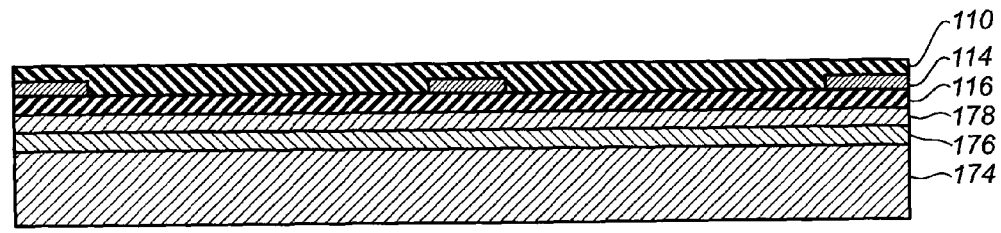
Figure 4D:
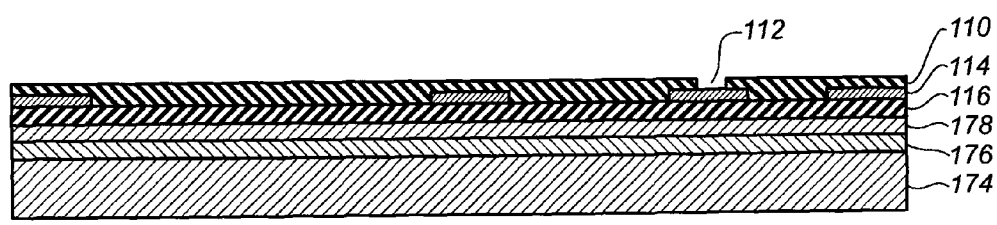

As illustrated in FIGS. 4B and 4C, respectively, the second patterned conductive layer 114 is formed on the third insulating layer 116 and the second insulating layer 110 is deposited on the second patterned conductive layer 114. The second patterned conductive layer 114 is defined lithographically to create portions or patterns that will become the global interconnect for the array. As illustrated in FIG. 4D, the via holes 112 are formed through the second insulating layer 110 to allow access to a portion of the second patterned conductive layer 114. In the preferred embodiment, the via hole 112 is formed at a position corresponding to the channel region of each transistor to be formed in subsequent steps, described below.

Figure 4E:
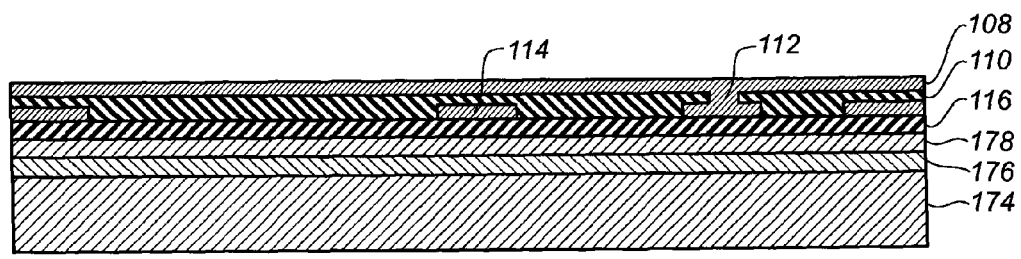
Figure 4F:
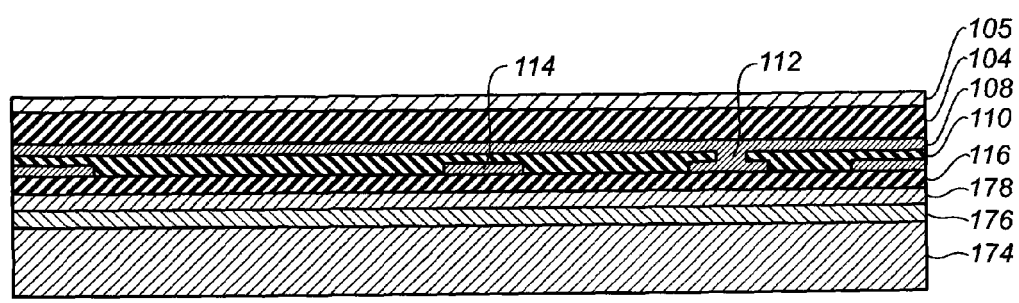

In FIG. 4E, the first patterned conductive layer 108 is formed on the second insulating layer 110. The first patterned conductive layer 108 may be patterned in any number of ways, according to the design of the imaging apparatus. In this embodiment, the first patterned conductive layer 108 is deposited to form at least a gate line for driving the transistor. To this end, the first patterned conductive layer 108 is deposited over the via hole 112, so as to be electrically connected to the second patterned conductive layer 114. The first insulating layer 104 is thereafter deposited on the first patterned conductive layer 108, as illustrated in FIG. 4F. The first insulating layer 104 acts as a top insulating layer. In the preferred embodiment, the surface of the first insulating layer is planarized, such as with chemical-mechanical polishing (CMP). Also, in the preferred embodiment, a silicon layer 105 is deposited on the first insulating layer 104. The silicon layer will provide a source of silicon atoms for the anodic bonding process.

Figure 4G:
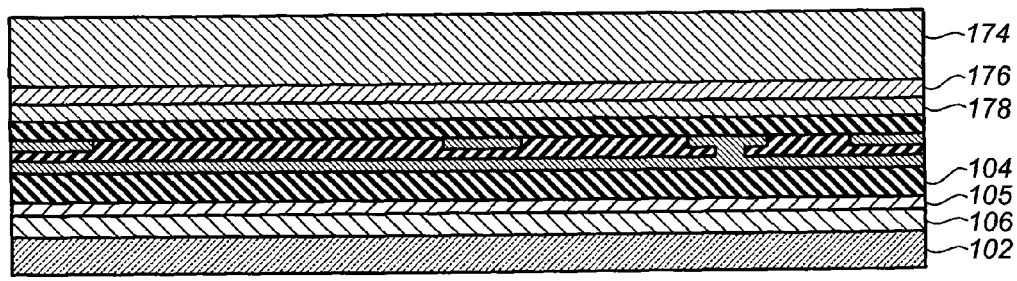

As illustrated in FIG. 4G, the surface of the silicon layer 105 is bonded by an anodic bonding process to the glass substrate 102. The resultant anodic bond 106 retains the layers formed in the steps of FIGS. 4A-4F, described above, on the glass substrate 102. Other bonding techniques, including, but not limited to, frit bonding, soldering, and adhesives could alternatively be used to bond the first insulating layer 104 to the glass substrate 102. In the case of frit bonding, for example, a bonding layer is comprised of particles ~0.1-1.0 micron in diameter formed of glass with lower softening temperature than the substrate 102. When soldering is used, a bonding layer comprised of a metal alloy with a melting temperature lower than that of the of the substrate is used to bond to first insulating layer 104 to the substrate. No anodic bond is formed when frit bonding or soldering or used. The type of bonding employed may vary based on the composition of the first insulating layer, or the application. However, anodic bonding is effective to bond a silicon layer to glass, and is used in the illustrated preferred embodiment of the invention. When other bonding techniques are used, it may not be necessary to include the silicon layer 105, as such other bonding techniques may lend themselves to direct bonding of the top insulating layer to the glass substrate.

Notably, the layers formed in the steps of FIGS. 4A-4F were formed on the silicon wafer 170, but in the step illustrated in FIG. 4G, the stack formed in FIGS. 4A-4F is inverted, such that the first or top insulating layer, i.e., the most-recently deposited layer, is bonded to the glass substrate 102. Accordingly, the upper-most, or exposed, layer in FIG. 4G is the originally provided layer—the silicon wafer 170.

Figure 4H:
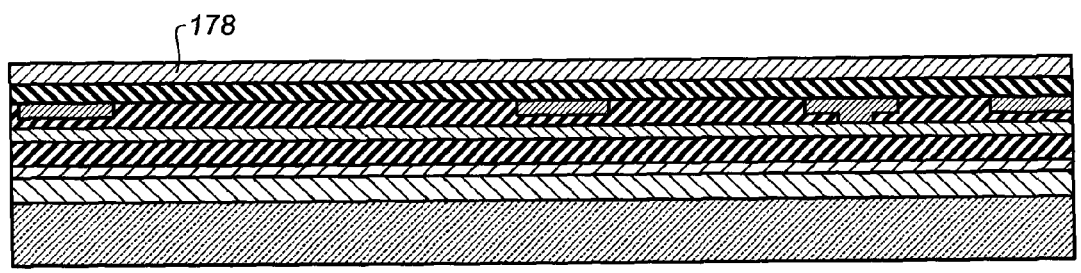

In the next step, illustrated in FIG. 4H, the silicon wafer is separated at the hydrogen-implanted region 176. More specifically, using known techniques, described, for example, in U.S. Pat. No. 7,178,526, the portion of the silicon wafer 170 on the side of the hydrogen-implanted region 176 closest the second surface 174 is removed. The thin region of silicon 178 is thereafter exposed and is all that remains of the silicon wafer 170. The exposed surface of this thin region of silicon 178 preferably also is polished, thereby removing regions of crystalline imperfection resulting from the hydrogen implant and the fracturing of the separation layer.

Figure 4I:
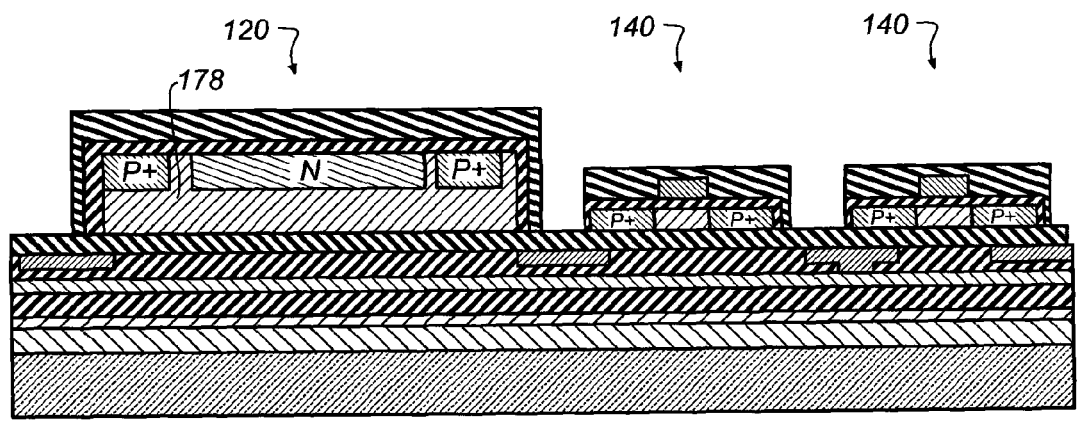

In FIG. 4I, the photosensor elements 120 and the transistor elements 140 are formed on the polished surface of the thin region of silicon 178. In this preferred embodiment, the thin region of silicon 178 forms the silicon layer 122 of the photosensor element 120 and the silicon layer 146 of the transistor element 140. Known etching techniques preferably are used to create the patterning for the silicon layers 122, 146. As illustrated, it may be desirable to thin out, relative to the photosensitive element, the portion of the thin region of silicon 178 used in the transistors. Techniques for forming the remaining components of the photosensor elements 120 and the transistors 140 are known in the art and will not be described herein in further detail.

Figure 4J:
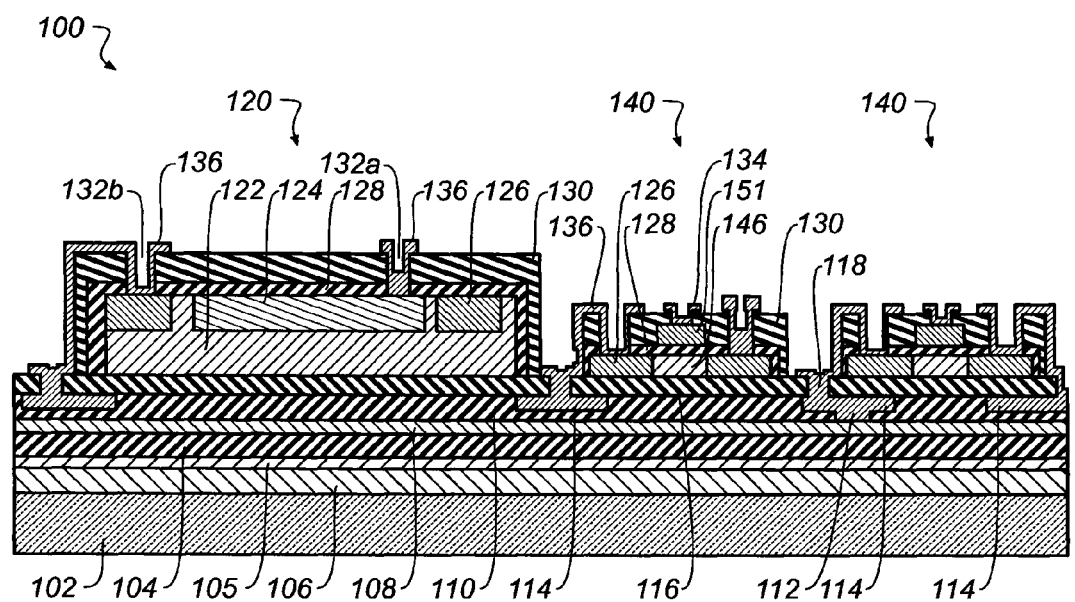

In FIG. 4J, interconnect is formed between the circuit elements formed on the polished surface of the thin region of silicon 178 and the patterned conductive layers 108, 114. Specifically, the vias 118, 132a, 132b are formed through the insulating layers at the top of the photosensors and transistors and to the second patterned conductive layer 114. The third and fourth patterned conductive layers 134, 136 then are formed, creating electrical interconnect between the circuit elements and the first patterned conductive layers.

As should be understood, an imager is formed by creating an array of the pixels on the glass substrate. The global interconnects at least partially embodied in the first and second patterned conductive layers are buried beneath the photosensors and the transistors, connecting the pixels. In preferred applications, a number of silicon wafers or tiles are bonded to a single glass substrate, with each wafer or tile then being formed into photosensitive and readout elements, according to the methods described above. Thus, for each wafer or tile, the first and second patterned conductive layers are global interconnect as to that specific wafer or tile. The wafers or tiles arranged at the periphery of the array preferably also include transistors or other elements forming the peripheral circuitry described in connection with FIG. 3. While such transistors may be substantially the same as the PMOS transistors described above, they may alternatively be NMOS sensors, in which N+ doped areas could be used as the source and drain regions. Fabrication of such elements is substantially the same as described above.

By fabricating the global interconnect layers on planes below the image sensor, the space required for the interconnect in the plane of the image sensor is greatly reduced. Specifically, the device can be fabricated such that the only space required for the global interconnect in the plane of the image sensor is that of a via hole. The via hole is typically on the order of about 4 microns by 4 microns, much smaller than the typical size of a signal line. Signal lines are typically about 8 microns wide and extend across the entire pixel, which likely is on the order of about 100 microns. This difference is particularly appreciated when multiple lines can be removed from above each pixel. Fill factor is greatly increased.

Burying the interconnect layers can also result in a lower capacitance for the interconnect. For instance, insulating layers can be made as thick as possible, because they are disposed below the image sensor. Increasing the thickness of the insulating layers reduces capacitance between other metal lines in adjacent interconnect planes. The distance between the first and second metallization layers can be increased to a distance that reduces or all but eliminates capacitance coupling between the layers. For example, thickness of the insulating layer in the preferred embodiment would be greater than 500 nm. Of course, selecting proper materials for the insulating layers, preferably those with low dielectric constant, such as silicon dioxide, can also reduce capacitive coupling between the metallization layers. By reducing the capacitance, circuit speed is improved, and circuit noise is reduced, and feedthrough between lines, such as between clock and data lines or between clock and bias lines, is lessened.

The pixel structure according to the preferred embodiment also results in lower resistance for the interconnect. As noted above, the insulating layers can be made as thick as possible, because they are disposed below the imaging sensor. This is also true for the metallization layers comprising the interconnect layers. In fact, the metallization layers can be made as thick and as wide as desired, to reduce resistance. The metallization layers would typically be comprised of aluminum in conjunction with thin films of other metals to act as barriers to metal diffusion or to reduce electro-migration. The thicknesses of these layers could be as great as 1,000 nm for low resistance. Similarly, the present techniques allow for fabrication of the metallization layers in materials such as copper, which inherently have lower resistivity. By decreasing the resistivity, circuit speed is improved, circuit noise is reduced, and feedthrough between lines, such as between clock and data lines or between clock and bias lines, is lessened.

The pixel structure of the invention also allows for a finer metal pitch, which is important for high density interconnect applications. Significantly narrower line widths in metal lines and smaller widths of vias are possible for lines and vias formed on silicon wafers as compared to conductive lines and vias formed using flat-panel process equipment used in the display manufacturing industry. Photolithography and etch equipment for silicon wafers can realize line widths from 45 nm to 1,000 nm routinely in production. Photolithography and etch equipment for flat-panel backplanes for display applications realizes line widths from 2,000 nm to 10,000 nm in production. As a result, the global interconnect layers fabricated on the silicon wafer before attachment to the glass can have total lower capacitance and also reduced capacitive coupling between layers than comparable interconnect fabricated on glass after attachment of the silicon wafer to the glass substrate.

The present invention also allows for more layers of metallization. The metal layers are fabricated on the silicon wafer, and since planarization processes such as chemical-mechanical polishing are commonly known, many metal layers can be stacked in the buried interconnect with planarized insulating layers in-between. Although only two metallization layers are illustrated in the preferred embodiment described above, additional metallization layers could readily be included. Planarization of insulating layers between metal layers is not a common process in flat-panel backplane fabrication on glass.

Moreover, although embodiments have been described in which the readout elements are formed in the same plane as the photosensitive elements, the invention is not limited to such an arrangement. In another embodiment, readout elements could be formed in the thin film silicon, as described above, and photosensitive elements such as amorphous silicon photosensitive elements could be formed on top of the readout elements, using known techniques. Such an arrangement could further maximize fill factor, because only the photosensitive elements would be contained on top uppermost plane of the device.

The foregoing embodiments of the invention are representative embodiments, and are provided only for illustrative purposes. The embodiments are not intended to limit the scope of the invention. Variations and modifications are apparent from a reading of the preceding description and are included within the scope of the invention. The invention is intended to be limited only by the scope of the accompanying claims.

PARTS LIST 10 pixel
12 photodiode
14 transfer gate transistor
16 amplifier transistor
18 reset transistor
20 row select transistor
21 horizontal global interconnect line
22 row select line
24 reset gate line
26 transfer gate line
27 vertical global interconnect
28 data line
30 voltage supply line
32 bias line
100 pixel
102 glass substrate
104 first insulating layer
105 silicon layer
106 anodic bond
108 first patterned conductive layer
110 second insulating layer
112 via hole
114 second patterned conductive layer
116 third insulating layer
118 vias
120 photosensor element
122 silicon layer
N+ doped silicon area
126 P+ doped silicon area
128 fourth insulating layer
130 fifth insulating layer
132a, 132b vias
134 third patterned conductive layer
136 fourth patterned conductive layer
140 transistor element
146 silicon layer
151 gate electrode
170 silicon wafer
172 first surface of silicon wafer
174 second surface of silicon wafer
176 hydrogen implanted zone
178 thin region of silicon
298 peripheral circuitry
300 vertical addressing circuitry
314 vertical address register stages
318 column amplifier and sampling circuitry
320 column amplifiers
322 clamp transistor
324 sample transistor
326 clamp voltage amplifier
327 column signal voltage amplifier
328 column select line
330 horizontal addressing circuitry
332 output amplifier
340 stage of horizontal address register
342 clamp clock interconnect line
344 sample gate
352 horizontal signal lines for signal voltage
354 horizontal signal lines for clamp voltage

The invention claimed is:

1. An imaging array comprising:
a glass substrate;
a first insulating layer attached to the glass substrate;
a first patterned conductive layer formed on the first insulating layer;
a second insulating layer formed on the first patterned conductive layer, on a side of the first patterned conductive layer opposite the first insulating layer;

a patterned single crystal silicon layer having a thickness of less than about 5 microns secured to the first insulating layer, on a side of the first insulating layer opposite the first patterned conductive layer; and an array of pixels including the patterned single crystal silicon layer, each pixel comprising a photosensitive element and a readout element.

2. The imaging array of claim 1, further comprising one or more layers of an electrical interconnect between each of the pixels and the first patterned conductive layer.

3. The imaging array of claim 1, further comprising one or more additional layers of interconnect, between the patterned conductive layer and the first insulating layer, each of the additional layers of interconnect comprising an additional patterned conductive layer and an additional insulating layer.

4. The imaging array of claim 3, wherein the first patterned conductive layer comprises interconnect for one of horizontal and vertical connection to the array of pixels and one of the additional patterned conductive layers comprises interconnect for the other of the horizontal and vertical connection to the pixels.

5. The imaging array of claim 3, further comprising peripheral circuitry disposed at the periphery of the array of pixels, the first patterned conductive layer and additional patterned conductive layers being electrically connected to the peripheral circuitry.

6. The imaging array of claim 1, wherein the single crystal silicon layer is formed by separating a single crystal silicon substrate at an internal separation layer.

7. The imaging array of claim 1, further comprising a silicon layer between the first insulating layer and the glass substrate, the silicon layer being attached by anodic bonding to the glass substrate.

8. The method of claim 2, further comprising a plurality of vias formed through the first dielectric layer to promote the electrical interconnect.

9. The imaging array of claim 1, further comprising peripheral circuitry disposed at the periphery of the array of pixels and electrically connected to the pixels through the patterned conductive layer.

10. The imaging array of claim 9, wherein the peripheral circuitry is one or more of row address circuitry, column address circuitry, signal sampling circuitry, signal amplification circuitry, voltage conversion circuitry, timing generation circuitry, signal processing circuitry, analog to digital conversion circuitry, electrostatic discharge protection circuitry, and signal interface circuitry.

11. The imaging array of claim 1, wherein the photosensitive element is formed of amorphous silicon.

12. The imaging array of claim 1, wherein the photosensitive element is formed in the single crystal silicon layer.

13. The imaging array of claim 12, wherein the photosensitive element is one of a p-n junction photodiode, a metal-insulator-semiconductor photo-capacitor, a charge coupled device, a phototransistor, and a pinned photodiode.

14. The imaging array of claim 11, wherein the photosensitive element is one of a p-n junction photodiode, a p-i-n photodiode, a metal-insulator-semiconductor photo-capacitor, and a phototransistor.

15. An imaging array, comprising:
means for providing a single crystal silicon substrate having an internal separation layer proximate a first surface of the substrate;
means for forming a first insulating layer proximate the first surface of the single crystal silicon substrate;
means for forming a patterned conductive layer on a side of the first insulating layer opposite the first surface of the substrate;
means for forming a top insulating layer on the patterned conductive layer, on a side of the patterned conductive layer opposite the first insulating layer;
means for securing the top insulating layer to a glass substrate;
means for separating the single crystal silicon substrate at the internal separation layer to create an exposed surface opposite the first side of the single crystal silicon substrate; and
means for forming, on the exposed surface, an array comprising a plurality of photosensitive elements and a plurality of readout elements.

* * * * *